US 12,288,978 B2

(12) United States Patent
Kuzelka et al.

(10) Patent No.: US 12,288,978 B2
(45) Date of Patent: Apr. 29, 2025

(54) ELECTROMECHANICAL MECHANISM FOR A SPARK-FREE ELECTRICAL CONNECTION IN AN ELEVATED OXYGEN ENVIRONMENT

(71) Applicant: GE Precision Healthcare LLC, Wauwatosa, WI (US)

(72) Inventors: Russell James Kuzelka, McFarland, WI (US); Donald L. Beduhn, Madison, WI (US); Chetankumar Amrutlal Modi, Bangalore (IN)

(73) Assignee: GE Precision Healthcare LLC, Wauwatosa, WI (US)

( * ) Notice: Subject to any disclaimer, the term of this patent is extended or adjusted under 35 U.S.C. 154(b) by 214 days.

(21) Appl. No.: 18/068,053

(22) Filed: Dec. 19, 2022

(65) Prior Publication Data

US 2024/0204509 A1 Jun. 20, 2024

(51) Int. Cl.
*H02H 3/08* (2006.01)
*H02H 7/22* (2006.01)
*H02H 9/02* (2006.01)
*H03K 5/24* (2006.01)

(52) U.S. Cl.
CPC ............... *H02H 7/22* (2013.01); *H03K 5/24* (2013.01)

(58) Field of Classification Search
CPC .................................. H02H 7/22; H03K 5/24
USPC ........................................................ 361/93.1
See application file for complete search history.

(56) References Cited

U.S. PATENT DOCUMENTS

| | | | |
|---|---|---|---|
| 6,400,203 B1 | 6/2002 | Rezzi et al. | |
| 6,644,986 B1* | 11/2003 | Wilker, Sr. | ............ H01R 25/006 |
| | | | 439/106 |
| 7,371,091 B2 | 5/2008 | Kojori | |
| 10,944,271 B1* | 3/2021 | Feng | ................... H01R 13/6683 |
| 2005/0048816 A1* | 3/2005 | Higgins | ............... H01R 13/648 |
| | | | 439/101 |

(Continued)

FOREIGN PATENT DOCUMENTS

TW I718397 B 2/2021

OTHER PUBLICATIONS

EP application 23212794.4 filed Nov. 28, 2023—extended Search Report issued May 17, 2024; 47 pages.

(Continued)

*Primary Examiner* — Jared Fureman
*Assistant Examiner* — Lucy M Thomas

(57) ABSTRACT

A system includes a plurality of electro-mechanical connectors disposed on a first electrical system. The plurality of electro-mechanical connectors includes at least a ground connector, an output power connector, a return power connector, and at least one signal connector. A power supply line in the first electrical system is connected through a current-limiting element to the output power connector. The system further includes a circuit detecting a loopback signal received from a second electrical system via the at least one signal connector indicating presence of a power connection between the first electrical system and the second electrical system, and a switch activable in response to a detected loopback signal to bypass the current-limiting element to pass a full unrestrained current and voltage on the power supply line to the output power connector.

20 Claims, 7 Drawing Sheets

(56) References Cited

U.S. PATENT DOCUMENTS

2007/0126318 A1\* 6/2007 Hamberg ............. A61G 13/107
                                                                   52/27
2010/0116633 A1    5/2010 Frey
2014/0125350 A1\* 5/2014 Senba ..................... H02H 3/087
                                                                 324/509

OTHER PUBLICATIONS

O'Sullivan, "Understanding Hot Swap: Example of Hot-Swap0 Circuit Design Process", Analog Dialogue, downloaded from https://www.analog.com/en/analog-dialogue/articles/understanding-hot-swap.html, retrieved on Dec. 1, 2022, 12 pages.
Sanogo, "The Art of Hot-Swapping in Telecom Systems: Avoid a Patchwork and Implement a More Effective Solution", Maxim Integrated; Tutorial 4705, Sep. 20, 2010, 9 pages.

\* cited by examiner

ELECTROMECHANICAL MECHANISM FOR A SPARK-FREE ELECTRICAL CONNECTION IN AN ELEVATED OXYGEN ENVIRONMENT

TECHNICAL FIELD

This description relates to coupling of an electrical subsystem to a host electrical system for power.

BACKGROUND

In many applications, an electrical subsystem is powered by a host electrical system. The electrical subsystem (e.g., computers and peripherals, monitors, sticks, and other electronics) may share power and/or data over one or more connectors with the host electrical system. An unpowered electrical subsystem may be connected (e.g., plugged in) to the host electrical system without shutting off power to the host electrical system. This may result, for example, in electrostatic discharges (ESD) or sparking at or near the one or more connectors. The ESD or sparking may electrically damage circuits in the host electrical system and or the electrical subsystem. The ESD or sparking may also increase a risk of fire or explosion when the unpowered electrical subsystem is connected (e.g., plugged in) to the host electrical system in an oxygen rich environment.

In some cases, the connectors include a male or plug part of the connector that seats in a female socket or receptacle. For mechanical alignment of the electrical module or subsystem the connectors can be keyed by their form factor so that each plug connector may be inserted into one and only one species of socket or receptacle.

SUMMARY

In a general aspect, a system includes a plurality of electro-mechanical connectors disposed on a first electrical system. The plurality of electro-mechanical connectors includes at least a ground connector, an output power connector, a return power connector, and at least one signal connector. A power supply line in the first electrical system is connected through a current-limiting element to the output power connector. The system further includes a circuit detecting a loopback signal received from a second electrical system via the at least one signal connector indicating presence of a power connection between the first electrical system and the second electrical system, and a switch activable in response to a detected loopback signal to bypass the current-limiting element to pass a full unrestrained current and voltage on the power supply line to the output power connector.

In a general aspect, a method includes connecting a power output terminal of a first electrical system to a power input terminal of a second electrical system, and connecting a signal contact of the first electrical system to a corresponding signal contact of the second electrical system to form a loopback signal path passing through the second electrical system and returning to the first electrical system. The method further includes supplying a voltage from a voltage source through a current limiter to the power output terminal of the first electrical system, and detecting a loopback signal on the loopback signal path indicating a power connection between the second electrical system and the first electrical system. The method further includes, in response to detecting the loopback signal, bypassing the current limiter to supply an unrestricted voltage that is not current limited from the voltage source to the power output terminal of the first electrical system.

The details of one or more implementations are set forth in the accompanying drawings and the description below. Other features will be apparent from the description and drawings, and from the claims.

Figure 1:
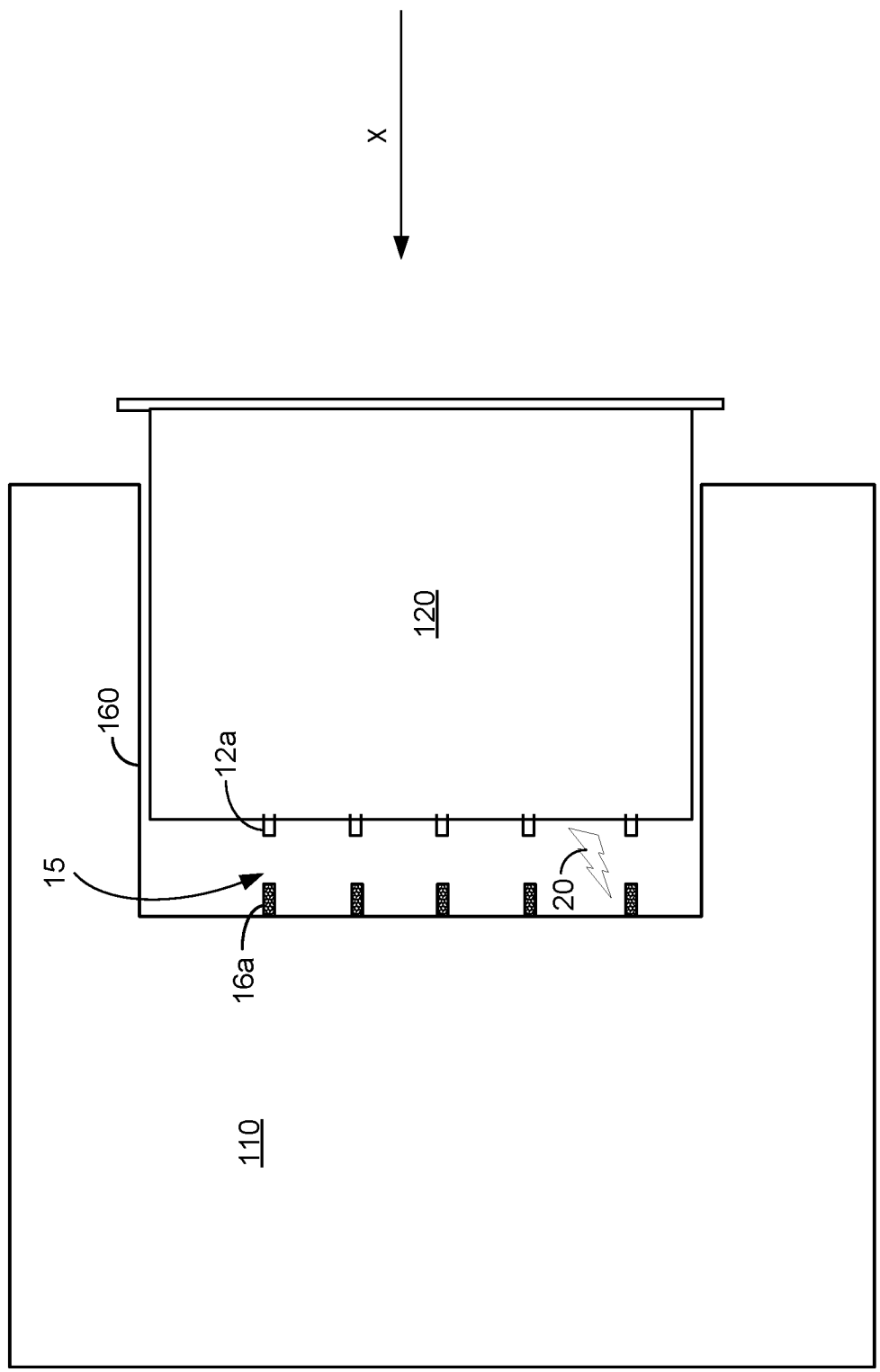
FIG. 1 is block diagram illustrating an electrical subsystem being coupled to a host electrical system.

In the drawings, which are not necessarily drawn to scale, like reference symbols or alpha numerals may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols or alpha-numeral identifiers that are repeated in multiple drawings may not be specifically discussed with respect to each of those drawings but are provided for context between related views. Also, not all like elements in the drawings are specifically referenced with a reference symbol or alpha-numeral identifier when multiple instances of an element are illustrated.

DETAILED DESCRIPTION

Systems and methods for hot swapping (i.e., connecting or disconnecting) an electrical subsystem into a host electrical system are described herein. The systems and methods can prevent sparks (that are caused, e.g., by discharge of charged capacitors) upon electrical connection of an unpowered electrical subsystem load during insertion, or the removal of a powered electrical subsystem load from the host electrical system. In some examples, the systems include electrical components that are sequentially coupled upon insertion and sequentially decoupled upon removal to help prevent sparking.

FIG. 1 is block diagram illustrating an electrical subsystem 120 being coupled to a host electrical system 110. Host electrical system 110 may include an opening (e.g., bay 160) in which electrical subsystem 120 can be placed (e.g., inserted, plugged-in, or docked). Bay 160 may include one or more electrical connectors 16a (e.g., ports, connectors, terminals, or pins, etc.) that can be in electrical contact with one or more electrical connectors 12a on electrical subsystem 120 to establish power and data signal pathways between the two systems. As electrical subsystem 120 is being moved (e.g., in the x direction) into bay 160, there can be air gaps (e.g., air gap 15) between electrical connectors 16a and electrical connectors 12a before full electrical contact is established between electrical connectors 16a and electrical connectors 12a. In situations where electrical connectors 16a and electrical connectors 12a are powered or there are large capacitive charges (e.g., static charge) built up there can be arcing or sparking due to electrostatic discharge (ESD) across the air gaps (e.g., air gap 15). In FIG. 1, an electrostatic discharge is represented pictorially, for example, as a lightning bolt (ESD 20). The ESD (which can occur both when electrical subsystem 120 is placed in, or removed from, bay 160) can present a safety hazard (especially in an oxygen rich ambient) in the presence of combustible material (e.g., cotton dust, lint, etc.).

In example implementations, the electrical subsystem 120 may be any electrically powered system (e.g., a computer system, server, medical device, telecom device, video game system, etc.). The electrical subsystem 120 may be any component or subsystem (e.g., power supply, motherboard, hard drive, game cartridge, USB interface, etc.) that can be interfaced with host electrical system 110 for power and or data communications.

As an example, in a medical environment, the host electrical system may be an anesthetic machine that is used to generate and mix a fresh gas flow of medical gases and inhalational anesthetic agents for the purpose of inducing and maintaining anesthesia in a patient (e.g., in a healthcare facility). The medical gases may for example, include oxygen or nitrous oxide, which as oxidizers or accelerants can be a fire hazard in the presence of combustible material (e.g., cotton dust, etc.).

The anesthetic machine can be integrated with or include one or more electrical subsystems related to, for example, a mechanical ventilator, a breathing system, suction equipment, patient monitoring devices, or a vaporizer, etc. The electrical subsystem, which can removably plugged into the anesthetic machine, may, for example, be a vaporizer that can provide accurate dosage control when using volatile anesthetics in the anesthetic machine.

The host electrical system may share power and/or data signals with the electrical subsystem system over one or more interfaces, and typically have a separate connector (electro-mechanical connector) for each interface. A set of electro-mechanical connectors for connecting the host electrical system and the electrical subsystem may, for example, include at least a ground connector, an output power connector, a return power connector, and at least a signal connector. Each of the electro-mechanical connectors may have a male plug-female socket (or receptacle) geometry or configuration. The connectors may be keyed by their form factor so that each "plug" connector may be inserted into one and only one species of "receptacle" or "socket."

The example systems and methods for hot swapping (i.e., connecting or disconnecting) the electrical subsystem into or from a host electrical system may involve a combination of a mechanical technique and an electrical technique to ensure that all the connectors are properly oriented and mated with the host electrical system in a state of a safe low power output before the electrical subsystem receives a full power output from the host electrical system.

The mechanical technique utilizes a set of electro-mechanical connectors (e.g., a ground connector, an output power connector, a return power connector, and at least a signal connector) that are staggered in length (in other words, have different lengths). The set of electro-mechanical connectors may, for example, be pogo pins with corresponding sockets or receptacles. The ground connector and the output and return power connectors may have lengths that are greater than the lengths of the signal connectors. As a result of the differences in the lengths of the connectors, when the electrical subsystem is inserted into (to become engaged with) the host electrical system, the ground connections between the two systems are mechanically made first and then the power connections are mechanically made before the signal connections are made. All connections may be made while the host electrical system has a safe current-limited low power output (e.g., limited to 24V, 16 mA). Conversely, when the electrical subsystem is removed (disengaged) from the host electrical system, the signal connections between the two systems break first before the ground and power connections break.

The electrical technique involves providing a current-limited safety extra low voltage signal (SELV) to the electrical subsystem to sense the coupling of the electrical subsystem with the host electrical system and forming a loopback signal path (through the electrical subsystem) that is enabled when the electrical subsystem is fully coupled to the host electrical system, an adjustable time delay circuit, and a solid-state electronic power switch.

Figure 2A:
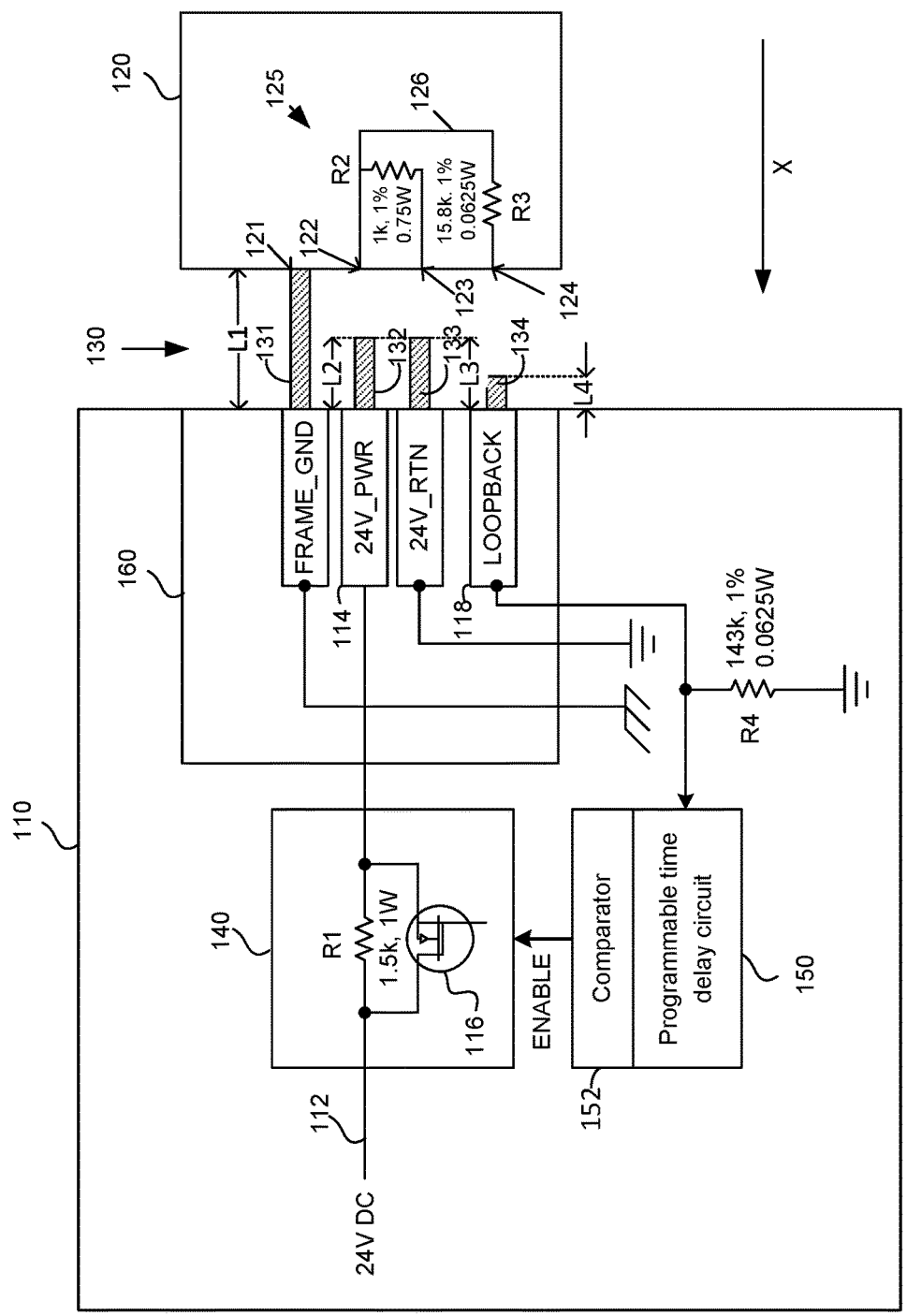
FIGS. 2A, 2B, and 2C schematically illustrate elements of a system for powering an electrical subsystem by a host electrical system.
Figure 2B:
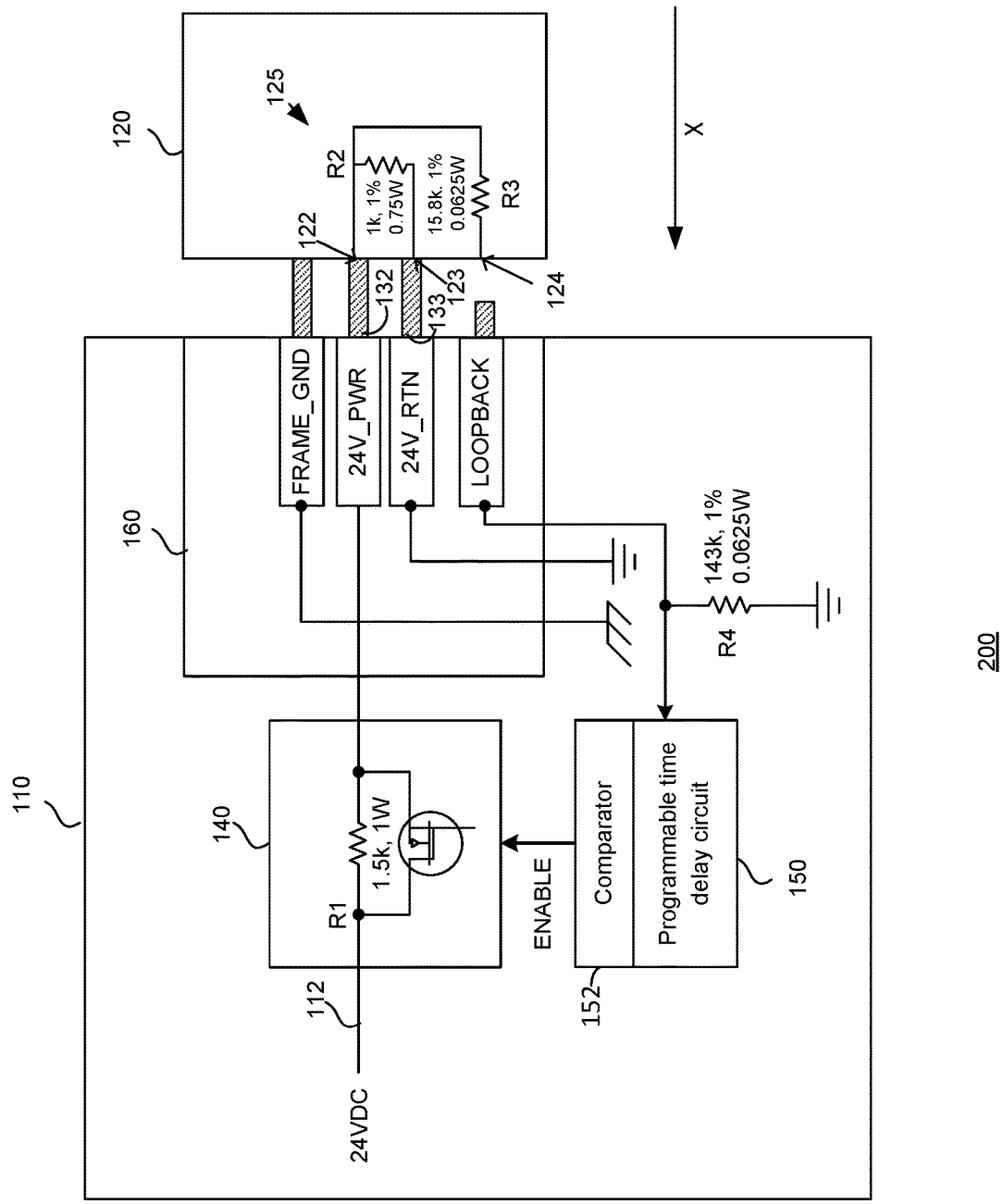
Figure 2C:
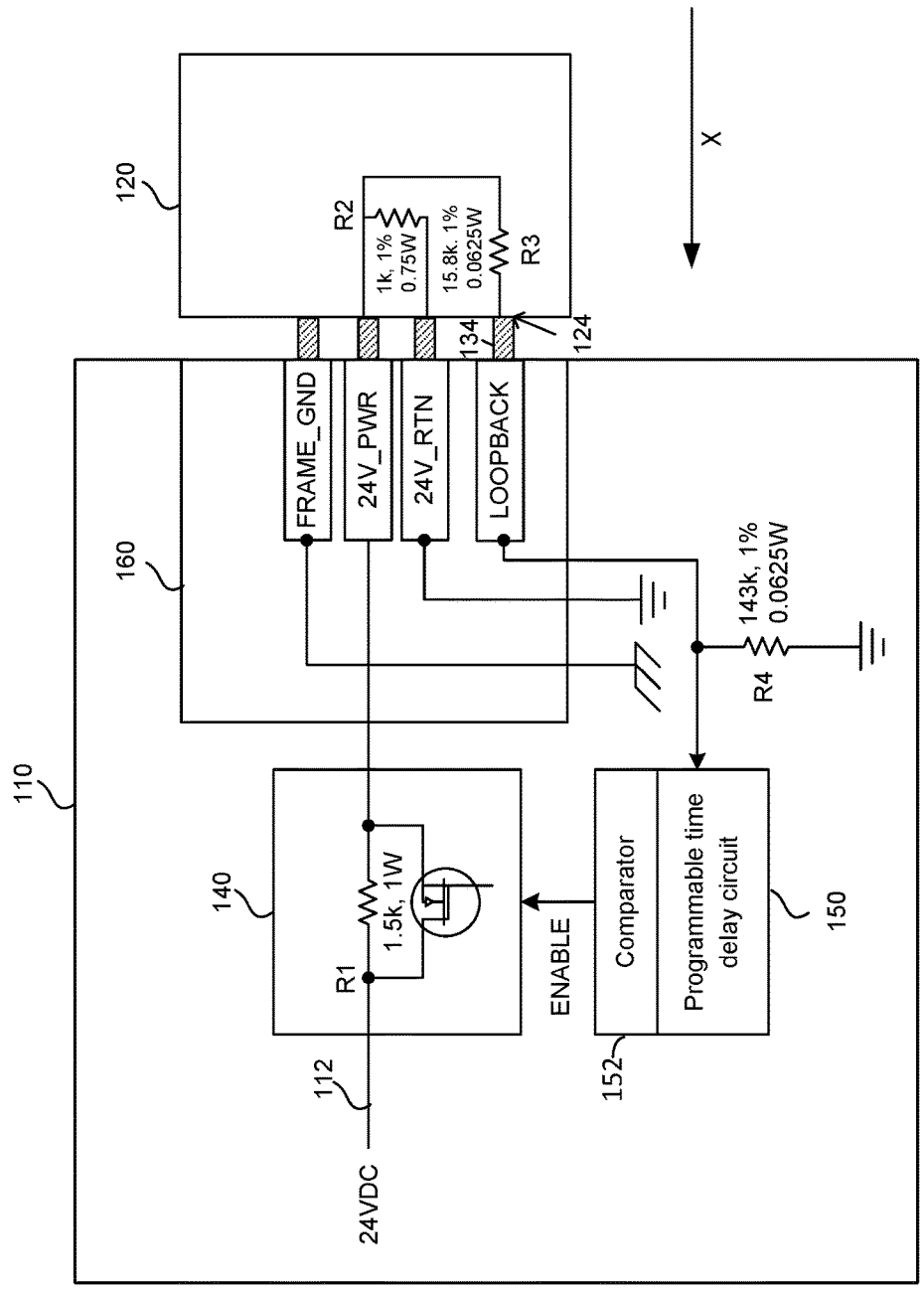

FIGS. 2A, 2B and 2C schematically illustrate elements of a system 200 for powering an electrical subsystem (e.g., electrical subsystem 120) by a host electrical system (e.g., host electrical system 110).

As an example, host electrical system 110 may be an anesthetic machine and electrical subsystem 120 may be a vaporizer (or other subsystem or module) that can be removably plugged into the anesthetic machine. Electrical subsystem 120 may, for example, be removably plugged into a bay (e.g., bay 160) in the host electrical system 110.

In example implementations, host electrical system 110 may include a power supply line (e.g., a 24 V power supply line 112) for powering electrical subsystem 120 through output power port 114. A switchable impedance (switchable impedance 140) may be disposed in power supply line 112 before output power port 114. In example implementations, switchable impedance 140 may include a current limiting resistance (e.g., resistor R) disposed in power supply line 112 in parallel with a solid-state electronic power switch (e.g., switch 116). In example implementations, switch 116 may, for example, be a metal-oxide-semiconductor field-effect transistor (MOSFET). When switch 116 is disabled (i.e., off) power supplied to output power port 114 on power supply line 112 may be current-limited (e.g., to 16 mA or less) by resistor R. When switch 116 is enabled (i.e., on) it shorts resistor R1 and the power supplied to output power port 114 by power supply line 112 is unrestrained (i.e., is not current limited).

Electrical subsystem 120 may include a frame ground contact 121, a power input port 122, a power return port 123, and a loopback signal port 124. A circuit 125 may provide a power return path across the load (represented, e.g., by resistor R2 in the FIG. 2A) of electrical subsystem 120. Circuit 125 may also include a loopback signal path 126 between power input port 122 and loopback signal port 124. Loopback signal path 126 may, for example, pass through a resistor R3 disposed in parallel with resistor R2.

Host electrical system 110 may enable (or disable) switch 116 in response to a loopback signal received on a loopback signal port (e.g., loopback signal port 118) from electrical subsystem 120. Receipt of the loopback signal from electrical subsystem 120 may indicate that electrical subsystem 120 is fully coupled to the host electrical system. In example implementations, host electrical system 110 may include a voltage comparator (e.g., comparator 152) coupled to a programmable time delay circuit 150 to determine if the loopback signal received from the electrical subsystem 120 has a voltage greater than a threshold voltage. When the loop back signal is greater than a threshold voltage (indicating that electrical subsystem is fully coupled to the host electrical system) host electrical system 110 may enable switch 116 to short resistor R in power supply line 112 and apply unrestrained (i.e., is not current limited) power to output power port 114.

In example implementations, host electrical system 110 includes a programmable time delay circuit (e.g., time delay circuit 150) to delay enabling of switch 116 after receipt of the loopback signal at the loopback signal port 118. In example implementations, a value of a time delay selected may depend on a consideration of the size of circuit capacitances in host electrical system 110 and electrical subsystem 120. The time delay selected may be in a range of a few milliseconds to a few seconds. For hot swapping a vaporizer in an anesthetic machine, a time delay of a few seconds (e.g., 10 to 20 seconds) may be used.

System 200 can be configured to deliver gradually increasing levels of power to electrical subsystem 120 from host electrical system 110. Host electrical system 110 may first deliver a reduced power level (e.g., a safe low power level) while confirming that the systems are fully connected (i.e., connected without air gaps) to reduce a risk of sparking that may occur across the air gaps at an unreduced power level (e.g., a higher power level). Only when the two systems are confirmed to be fully connected, host electrical system 110 may supply the unreduced power level to electrical subsystem 120.

In example implementations, system 200 includes a set of electro-mechanical connectors (e.g., set 130) that may, for example, include a frame ground connector 131, a power output connector 132, a power return connector 133, and at least a signal connector 134. As shown schematically in FIG. 2A, frame ground connector 131 may have a length L1, power output connector 132 may have a length L2, power return connector 133 may have a length L3, and signal connector 134 may have a length L4. In some example implementations, the lengths of the different connectors may be staggered, for example, with L1>L2>L3>L4. In some other example implementations, as shown in FIG. 2A, power output connector 132 may have a same length as power return connector 133 (in other words, L2 may equal L3, and L1>L2=L3>L4). The set of electro-mechanical connectors (e.g., set 130) may be disposed within bay 160 (e.g., toward a back of bay 160), but for visual clarity are shown in FIG. 2A as being disposed between host electrical system 110 and electrical subsystem 120 with lengths L1, L2, L3 and L4 extending outside bay 160.

In example implementations, as shown in FIG. 2A, when electrical subsystem 120 is moved (e.g., in a X direction) for placement in bay 160 of host electrical system 110, first, frame ground connector 131 having length L1 may engage frame ground contact 121 to ground a frame or chassis of electrical subsystem 120.

Next, as shown in FIG. 2B, when electrical subsystem 120 is further moved (e.g., in the X direction) for placement in bay 160, power output connector 132 and power return connector 133 each having length L2 may engage power input port 122 and power return port 123, respectively, on electrical subsystem 120. Host electrical system 110 may provide a current-limited safety extra low voltage (SELV) signal to electrical subsystem 120 via power output connector 132. The current-limited safety extra low voltage (SELV) may be a 24V signal of 16 mA or less that flows through resistor R1 in host electrical system 110 and resistor R2 in electrical subsystem 120. The values of the current-limited safety extra low voltage (SELV) (e.g., 24V, 16 mA) may comply with industrial standards for medical safety (e.g., International Electrotechnical Commission (IEC) standard—IEC 60601-1-1 Ed. 2.0 b:2000, Medical Electrical Equipment—Part 1-1: General Requirements for Safety—Collateral Standard: Safety Requirements for Medical Electrical System).

Next, as shown in FIG. 2C, when electrical subsystem 120 is further moved (e.g., in a X direction) for placement in bay 160, signal connector 134 having length L3 may engage loopback signal port 124 to complete loopback signal path 126 through electrical subsystem 120. With the current-limited safety extra low voltage (SELV) signal (e.g., 24V, 16 mA) applied to power output connector 132, a flowback signal (e.g., a low voltage trigger signal) may flow over loopback signal path 126 through electrical subsystem 120 to an input of the programmable time delay circuit 150.

As previously noted, a presence of a loopback signal over path 126 with the current-limited safety extra low voltage (SELV) signal (e.g., 24V, 16 mA) applied to power output connector 132 can confirm that electrical subsystem 120 has been properly plugged in bay 160 and is fully connected (i.e., connected without air gaps in any of the set of electro-mechanical connectors (e.g., set 130) that couple electrical subsystem 120 and host electrical system 110). After detecting a loopback signal with the current-limited safety extra low voltage (SELV) signal (e.g., 24V, 16 mA) applied to power output connector 132, host electrical system 110 can increase the power applied to power output connector 132 to an unrestrained value without current limitations (e.g., by enabling switch 116 to short current-limiting resistor R1 and allowing a full unrestricted current flow to electrical subsystem 120).

In example implementations, when electrical subsystem 120 is removed from host electrical system 110, signal connector 134 of length L3 being the shortest of the set of electro-mechanical connectors (e.g., set 130) mechanically disengages first breaking the flow of the loopback signal. When the flow of the loopback signal breaks, switch 116 is turned on reintroducing the current-limiting resistor R1 in power supply line 112. The flow of unrestricted current to electrical subsystem 120 is disabled and reverts to the 24 V 16 mA current limited state.

Figure 3:
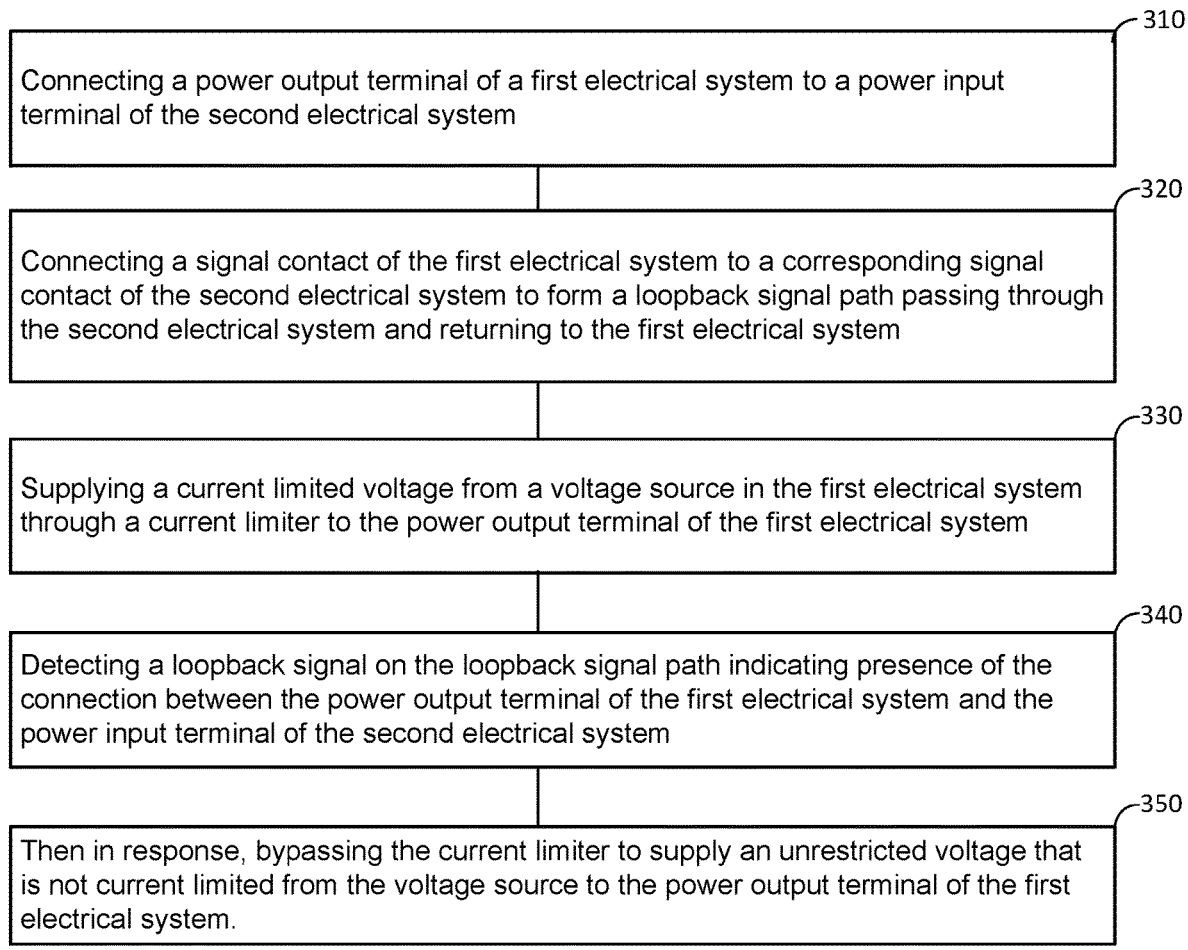
FIG. 3 is a flow chart of an example method for hot swapping an electrical subsystem into a host electrical system.

FIG. 3 shows an example method 300 for hot swapping an electrical subsystem (a second electrical system) into a host electrical system (a first electrical system).

Method 300 includes connecting a power output terminal of the first electrical system to a power input terminal of the second electrical system (310) and connecting a signal contact of the first electrical system to a corresponding signal contact of the second electrical system to form a loopback signal path passing through the second electrical system and returning to the first electrical system (320).

Method 200 further includes supplying a current limited voltage from a voltage source in the first electrical system through a current limiter to the power output terminal of the first electrical system (330), detecting a loopback signal on the loopback signal path indicating presence of the connection between the power output terminal of the first electrical system and the power input terminal of the second electrical system (340), and then in response, bypassing the current limiter to supply an unrestricted voltage that is not current limited from the voltage source to the power output terminal of the first electrical system (350).

Figure 4:
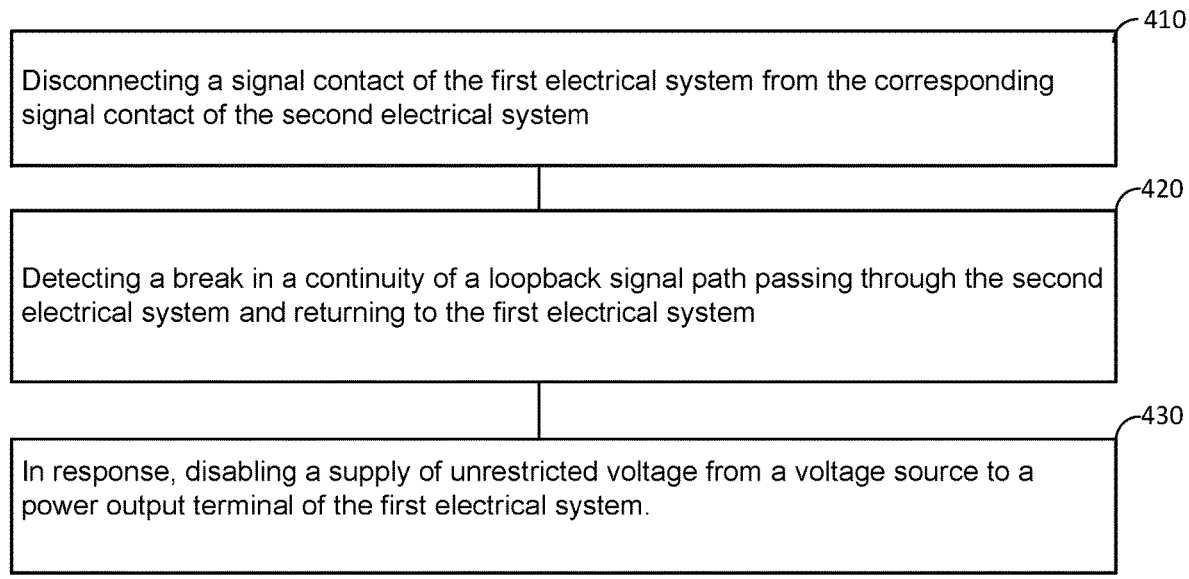
FIG. 4 is a flow chart for an example method for hot swapping an electrical subsystem out of a host electrical system.

FIG. 4 shows an example method 400 for hot swapping an electrical subsystem (a second electrical system) out of a host electrical system (a first electrical system).

For hot swapping the second electrical system out of the first electrical system, method 400 can include disconnecting a signal contact of the first electrical system from the corresponding signal contact of the second electrical system (410), detecting a break in a continuity of a loopback signal path passing through the second electrical system and returning to the first electrical system (420), and in response, disabling a supply of unrestricted voltage from a voltage source to a power output terminal of the first electrical system (430).

Figure 5A:
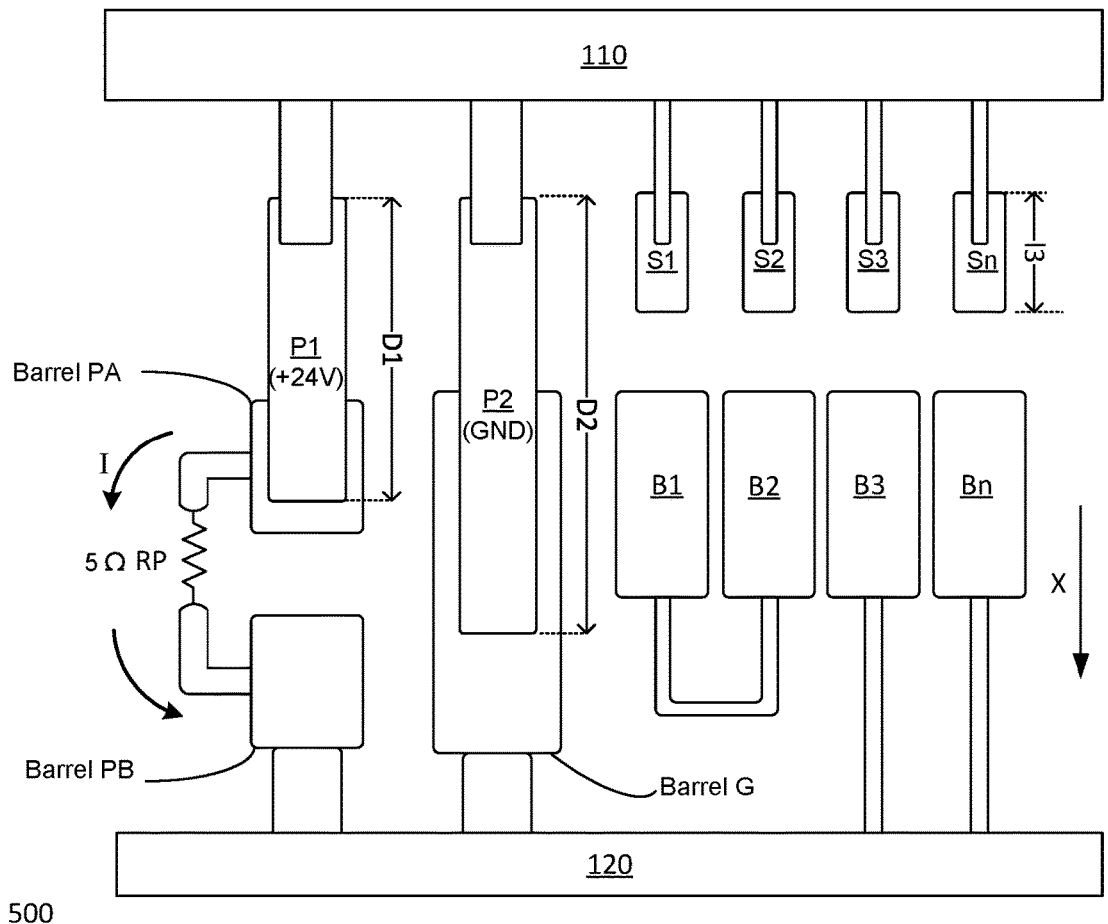
FIG. 5A and FIG. 5B schematically illustrate an example set of electro-mechanical connectors.
Figure 5B:
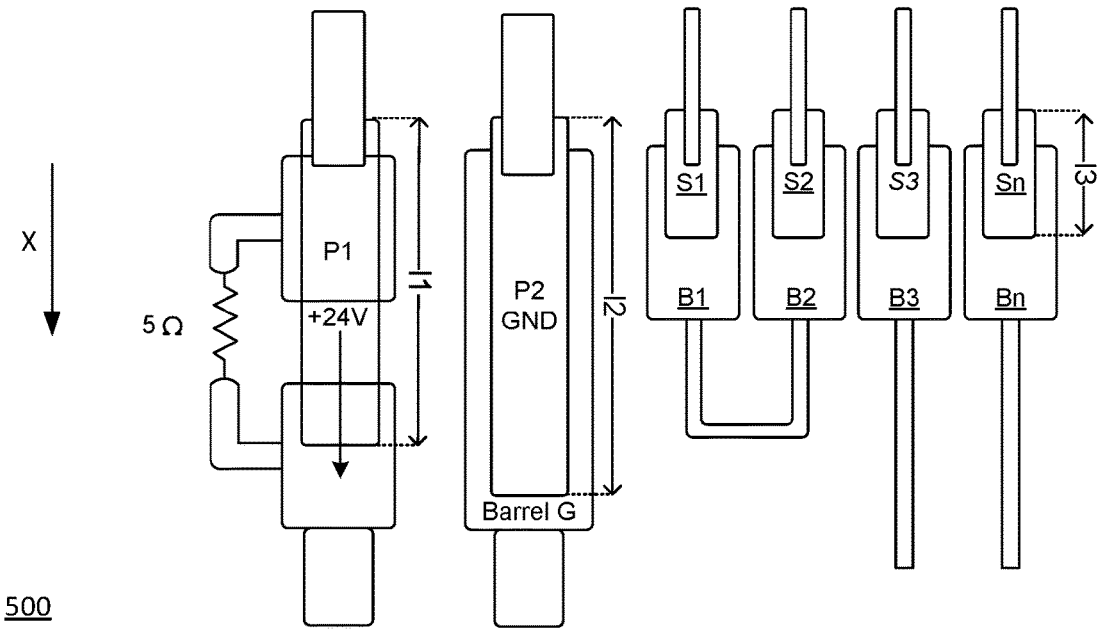

FIG. 5A and FIG. 5B illustrate a set of electro-mechanical connectors (e.g., set of electro-mechanical connectors 500) that can be used (e.g., in system 200 and methods 300 and 400) to connect the host electrical system (host electrical system 110) and the electrical subsystem (electrical subsystem 120) to share power and/or data signals over one or more interfaces. Each of the example set of electro-mechanical connectors 500 may have a male plug-female socket (or receptacle) geometry or configuration. The various electro-mechanical connectors in the set may have different lengths. In the example set of electro-mechanical connectors 500 shown in FIGS. 5A and 5B, the electro-mechanical connectors can be pogo pins each with a corresponding socket (or receptacle). The set of electro-mechanical connectors 500 may for example, include pogo pin P1 with corresponding receptacle (barrel PA and barrel PB), pogo pin P2 with corresponding receptacle (barrel G), and signal pogo pins S1, S2, S3 . . . Sn with corresponding receptacles B1, B2, B3, . . . Bn. In example implementations, the pogo pins and the corresponding receptacles may be made of metal of other conductive materials.

Pogo pin P1 may be a power connector initially carrying a current limited SELV (e.g., 24 V). Pogo pin P1 may have a length D1 and may have a form configured to couple with its corresponding receptacle—first through barrel PA and then into barrel PB in sequence. Barrel PA and barrel PB may be linked by a current limiting resistor RP (e.g., a 5-ohm resistor). Pogo pin P2 may be a ground connector with a length D2. Pogo pins S1, S2, S3, . . . Sn, each having a length 13, may be signal contact connectors. The lengths of the various pogo pins may be ordered so that the length D2 of ground pogo pin P2 is greater than the length D1 of power pogo pin P1, which in turn is greater than the length D3 of each of the signal contact pogo pins S1, S2, S3, . . . Sn.

As electrical subsystem 120 is inserted in host electrical system 110 (e.g., in the −X direction), pogo pin P2 being the longest pin (length D2) makes contact first to ground the frame of electrical subsystem 120. Next, pogo pin P1 carrying the SELV voltage (e.g., 24 V) and having a length D1 contacts its corresponding receptacle—barrel PA and barrel PB. First, pogo pin P1 reaches barrel PA and connects to the downstream load through the current limiting resistor RP linking barrel PA to barrel PB. The presence of the current limiting resistor RP in the conduction path limits inrush current I and mitigates a risk of a potential arc or spark. As the insertion process continues, pogo pin P1 shorts out the current limiting resistor RP once it reaches barrel PB. Pogo pin P1 then seats in barrel PB to establish a low ohmic connection to the downstream electrical subsystem 120 (e.g., a vaporizer or other medical device).

After pogo pin P1 is reaches and is seated in barrel PB, signal pogo pins S1, S2, S3 . . . Sn reach the corresponding receptacles B1, B2, B3, . . . Bn to make signal contact connections between electrical subsystem 120 and host electrical system 110. The signal contact connections may include, for example, a loopback connection formed by signal pogo pins S1, S2, and the corresponding receptacles B1, B2. After these signal contact connections between electrical subsystem 120 and host electrical system 110 are made, communications between electrical subsystem 120 and host electrical system 110 can be positively made and bulk power (i.e., the unrestrained voltage) can be safely turned on pogo pin P1 by the host electrical system 110.

FIG. 5B shows, for example, the positions of pogo pin P1, pogo pin P2 and signal pogo pins S1, S2, S3 . . . Sn in the corresponding receptacles (e.g., barrel PB, barrel G, B1, B2, B3, . . . Bn) on completion of inserting electrical subsystem 120 in host electrical system 110.

In the converse process of removing electrical subsystem 120 from host electrical system 110 (e.g., in the X direction), the signal contact connections between electrical subsystem 120 and host electrical system 110 break first. This includes for example, breaking of loopback connection formed by signal pogo pins S1, S2, and the corresponding receptacles B1, B2. Once the loopback connection breaks continuity, the power supply to the electrical subsystem 120 and host electrical system 110 can be disabled by host electrical system 110, as discussed, for example, in the foregoing with references to FIG. 2A.

Further, in the process of removing electrical subsystem 120 from host electrical system 110, the low ohmic connection to the downstream electrical subsystem 120 made by pogo pin P1 breaks, and then lastly the ground connection made by pogo pin P2 breaks to fully disengage electrical subsystem 120 from host electrical system 110.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It will be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising," and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

What is claimed is:

1. A system comprising:
a first plurality of electro-mechanical connectors disposed on a first electrical system, the first plurality of electro-mechanical connectors including at least a first-system ground connector, a first-system output power connector, and at least one first-system signal connector, wherein the first-system output power connector is a pogo pin;
a power supply line connected through a first current-limiting resistor to the first-system output power connector;
a circuit detecting a loopback signal received from a second electrical system via the at least one signal connector indicating presence of a power connection between the first electrical system and the second electrical system, the second electrical system including a second plurality of electro-mechanical connectors for connecting to respective ones of the first plurality of electro-mechanical connectors disposed on the first electrical system; and
a switch activable in response to a detected loopback signal to bypass the current-limiting resistor and to pass a full unrestrained current and voltage on the power supply line to the first-system output power connector,
wherein the second plurality of electro-mechanical connectors includes at least a second-system input power connector, the second-system input power connector including a first barrel receptacle aligned with and electrically connected to a second barrel receptacle by a second current-limiting resistor, and wherein the pogo pin initially carrying a current-limited safety extra low voltage signal (SELV) is configured to couple to the second-system input power connector by first passing through the first barrel receptacle and then into the second barrel in sequence, the second current-limiting resistor being configured to limit an inrush current.

2. The system of claim 1, wherein the plurality of electro-mechanical connectors is arranged such that when the second electrical system is being connected to the first electrical system:
the ground connector grounds the second electrical system to a frame of the first electrical system;
after the second electrical system is grounded, the output power connector connects the second electrical system to the output power connector; and
after the second electrical system is connected to the output power connector, the at least one signal connector enables a loopback signal path through the second electrical system back to the first electrical system.

3. The system of claim 1, wherein the plurality of electro-mechanical connectors further includes a return power connector.

4. The system of claim 1, wherein the ground connector has a first length, the output power connector has a second length, and the at least one signal connector has a third length, and wherein the first length is greater than the second length and the second length is greater than the third length.

5. The system of claim 1, wherein the first plurality of electro-mechanical connectors includes a set of pogo pins and the second plurality of electro-mechanical connectors includes a corresponding set of receptacles.

6. The system of claim 1, wherein the first electrical system and the second electrical system are medical devices, and the power supply line supplies a voltage of 24 V with a current limit of 16 mA to the output power connector.

7. The system of claim 1, wherein the switch activable to bypass the first current-limiting resistor is a metal-oxide-semiconductor field-effect transistor (MOSFET).

8. The system of claim 1, wherein a programmable time delay circuit is disposed before the switch in the circuit detecting the loopback signal before the switch.

9. The system of claim 1, wherein the circuit detecting the loopback signal includes a voltage comparator.

10. The system of claim 1, wherein the circuit detecting the loopback signal is further configured to detect a break in a continuity of a loopback signal path passing through the second electrical system and returning to the first electrical system; and wherein, in response, the switch is configured to disable passage of the full unrestrained current and voltage on the power supply line to the first-system output power connector.

11. A method comprising:
connecting a power output terminal of a first electrical system to a power input terminal of a second electrical system to pass a current-limited safety extra low voltage signal (SELV) while moving a pogo pin of the power output terminal sequentially through a first pogo pin receptacle and a second pogo pin receptacle of the power input terminal, the first pogo pin receptacle and the second pogo pin receptacle connected by a current-limiting resistor, the current-limiting resistor being configured to limit an inrush current;
connecting a signal contact of the first electrical system to a corresponding signal contact of the second electrical system to form a loopback signal path passing through the second electrical system and returning to the first electrical system;
detecting a loopback signal on the loopback signal path indicating a presence of a power connection between the second electrical system and the first electrical system; and
in response to detecting the loopback signal, bypassing a current limiter in a voltage source to supply an unrestricted voltage that is not current limited from the voltage source to the power output terminal of the first electrical system.

12. The method of claim 11, wherein the first electrical system and the second electrical system are medical devices, and wherein supplying the un-restricted voltage from the voltage source bypassing the current limiter to the power output terminal of the first electrical system includes supplying a voltage of 24 V with a current limit of 16 mA to the power output terminal.

13. The method of claim 11, wherein a switch is disposed in parallel to the current limiter in a power supply line, and wherein bypassing the current limiter to supply the unrestricted voltage includes activating the switch to short the current limiter.

14. The method of claim 13, wherein the switch is a metal-oxide-semiconductor field-effect transistor (MOSFET).

15. The method of claim 13, wherein a programmable time delay circuit is disposed before the switch in a circuit detecting the loopback signal, and wherein activating the switch includes activating the switch with a time delay after detecting the loopback signal to short the current limiter.

16. The method of claim 11, wherein a ground connector has a first length, an output power connector and a return power connector, each have a second length, and at least one signal connector has a third length, and wherein the first length is greater than the second length and the second length is greater than the third length.

17. The method of claim 16, wherein each of the ground connector, the output power connector, the return power connector, and the at least one signal connector include a pogo pin and a corresponding receptacle.

18. The method of claim 16, wherein connecting the power output terminal of the first electrical system to the power input terminal of the second electrical system includes first using the ground connector to ground the second electrical system to a frame of the first electrical system.

19. The method of claim 11, further comprising:
detecting a break in a continuity of the loopback signal path passing through the second electrical system and returning to the first electrical system; and
in response, stop supplying the unrestricted voltage that is not current limited from the voltage source to the power output terminal of the first electrical system.

20. The method of claim 19, wherein the break in the continuity of the loopback signal path is a result of disconnecting the signal contact of the first electrical system from the corresponding signal contact of the second electrical system.

* * * * *